(12) United States Patent
Allard et al.

(10) Patent No.: US 6,233,694 B1
(45) Date of Patent: May 15, 2001

(54) SYNCHRONIZATION DEVICE FOR SYNCHRONOUS DYNAMIC RANDOM-ACCESS MEMORY

(75) Inventors: Jean-Marc Allard, Gières; Frédéric Plissonneau, Thorigné-Fouillard; Alain Sorin, Cesson-Sévigné, all of (FR)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/211,229

(22) Filed: Dec. 14, 1998

(30) Foreign Application Priority Data

Dec. 24, 1997 (FR) .................................................. 97 16476

(51) Int. Cl.[7] .............................. G06F 1/04; G06F 12/00
(52) U.S. Cl. ........................................... 713/400; 711/167
(58) Field of Search .......................... 713/400; 711/105, 711/111, 167; 365/189.05

(56) References Cited

U.S. PATENT DOCUMENTS

| 5,448,715 | 9/1995 | Lelm et al. ........................... 395/550 |
|---|---|---|
| 5,630,096 | 5/1997 | Zuravleff et al. ..................... 395/481 |
| 5,802,596 | * 9/1998 | Shinozaki .............................. 711/169 |
| 5,896,347 | * 4/1999 | Tomita et al. .................. 365/189.05 |
| 6,014,339 | * 1/2000 | Kobayashi et al. .................. 365/233 |

FOREIGN PATENT DOCUMENTS 01261325   5/1991   (JP) .

* cited by examiner

Primary Examiner—Thomas M. Heckler
(74) Attorney, Agent, or Firm—Joseph S. Tripoli; Ronald H. Kurdyla; Joel M. Fogelson

(57) ABSTRACT

The device is connected to a memory (7) by an address bus and a data bus. It is characterized in that, on a clock output, it delivers a clock signal (clki_b) to be sent to the clock input of the memory (6), in that the clock signal. (clki) utilized for buffering the addresses and the data to be sent to the memory is the same, with the possible exception of having undergone signal inversion, as the one (clki_b) delivered on the clock output, and in that the same signal (clki_b) is utilized by the buffer (r1) receiving the data from the memory to buffer the data sent by the dynamic memory on the data bus.

4 Claims, 3 Drawing Sheets

SYNCHRONIZATION DEVICE FOR SYNCHRONOUS DYNAMIC RANDOM-ACCESS MEMORY

FIELD OF THE INVENTION

The invention relates to processing circuits utilizing synchronous dynamic random-access memories (SDRAMs) and, more particularly, synchronization devices for such SDRAM memories.

BACKGROUND OF THE INVENTION

SDRAM memories were developed to adapt to the ever increasing operating speed of processing circuits of the microprocessor type. While standard DRAM memories have a transfer frequency limited to a few tens of megahertz, architectures with SDRAM memories can achieve operating frequencies of 100 MHz or more.

SDRAM memories utilize a synchronous interface circuit where all the signals are sampled on the same clock edge. These signals are, for example, the address and data signals, the control and instruction signals such as "cs", "ras", "cas", "we", "dqm" whose definition and functions are explained in any manufacturer documentation concerning SDRAM memories and which will therefore be dealt with only in brief here.

Read operation

The time diagram relating to a read operation for an SDRAM is given in FIG. 1. This read operation depends on two programmable parameters referred to as "cas latency" and "burst length".

In the example in FIG. 1, the "cas latency" instruction corresponding to the latency time in read mode is equal to 3. This means that the data dq are read three cycles after the read instruction has been received. The "burst length" instruction is equal to 4, which means that four consecutive data are extracted from the same received address information. The dotted line 1 corresponds to the activation of the address (ad) as a "row" address by the ras signal (row address strobe) and the dotted line 2 corresponds to the activation of the address (ad) as a "column" address by the cas signal (column address strobe) with read instruction. The latency time corresponds to the time between the application of the "column" address (ad) and the data output. The dotted line 3 corresponds to the reading of the valid data dq, 3 clock cycles after the cas signal.

Write operation

The time diagram relating to a write operation for an SDRAM is given in FIG. 2. This operation depends on the "burst length" signal which represents the number of consecutive data which are written from the same address information. The dotted line 4 corresponds to the row addressing (ras). The dotted line 5 corresponds to the column addressing (cas) with the activation of the write instruction (we).

Again with reference to FIG. 1 and the read operations, the time Tac is the access time for the data after the clock rising edge corresponding to the last cycle as defined by the latency time, and Toh is the holding time for these data after the next clock rising edge (therefore corresponding to the latency time). When the operating frequency is high, the data dq which have been read remain valid for a short period of time, as represented by the unhatched "valid data" signal segment through which the dotted line 3 passes in FIG. 1. For example, for 100 MHz clock frequency and for times Tac and Toh of respectively 8.5 ns and 3 ns, the time for which the data which has been read remains valid and can therefore be acquired is:

10 ns−8.5 ns+3 ns=4.5 ns

Acquisition of these data within this time interval requires that the clock of the circuit managing the SDRAM memory, which circuit will be referred to below as the controller, and the SDRAM memory's own clock be in phase. If this is not so, then it will not be possible for the data to be dealt with reliably.

If the controller is an integrated circuit, or part of an integrated circuit, the control, address and data signals sent to the SDRAM memory by this circuit, which are synchronized with the internal clock derived from the external clock signal received on the clock input of the circuit, will not generally be synchronized with the external clock signal directly received by the SDRAM memory, even though the signals sent to these two clock inputs are the same, as explained below.

FIG. 3 represents an SDRAM memory controller 6 which is connected to an SDRAM memory 7 by a link 8 for exchanging the control, address and data signals, according to the prior art.

The same clock H is sent to the input of the memory controller circuit 6 and to the input of the SDRAM memory 7. The controller receives this clock on its clock input and distributes it to the various circuits which need to be synchronized with this clock. In order for this to be done, the clock signal which is received needs to be "buffered" several times for a tree distribution, before being delivered to the circuits which exchange signals on the link with the SDRAM memory, as indicated in FIG. 3. Each buffer circuit creates a delay of a few nanoseconds, and an overall delay of the order of 5 to 10 nanoseconds can make this direct link 8 between the controller and the memory unreliable, because of the desynchronization between the clock H and the signals exchanged on this link.

Of course, the controller may use PLL circuits (phase locked loops). But such circuits increase the complexity and cost of producing ASICs. Delay lines may also be utilized, but there are known problems inherent with components of this type, their calibration needs to be perfect and fine adjustment is expensive.

SUMMARY OF THE INVENTION

The object of the invention is to overcome the drawbacks mentioned above. To this end, the invention relates to a synchronization device for synchronous dynamic random-access memory, which device is connected to at least one memory by an address bus (AD) and a data bus (DO), the memory having a clock input, the device comprising a first buffer (r5) which receives data (Di_w) to be sent to the memory on the data bus, a second buffer (r4) which receives addresses (ADi) to be sent to the memory on the address bus, and a third memory (r1) which receives the data which come from the memory and are sent on the data bus, characterized in that, on a clock output, it delivers a clock signal (clki_b) to be sent to the clock input of the memory, in that the clock signal (clki) utilized for buffering the addresses and the data is the same, with the possible exception of having undergone signal inversion, as the one (clki_b) delivered on the clock output, and in that the same signal (clki_b) is utilized by the third buffer (r1) to buffer the data sent by the dynamic memory on the data bus.

BRIEF DESCRIPTION OF THE DRAWINGS

The characteristics and advantages of the invention will become more apparent from the following description which is given by way of example and with reference to the appended figures, in which.

DETAILED DESCRIPTION OF PREFERRED EMBODIMENTS

By virtue of the invention, it is possible to exchange data reliably between the controller circuit and the SDRAM memory.

Figure 4:
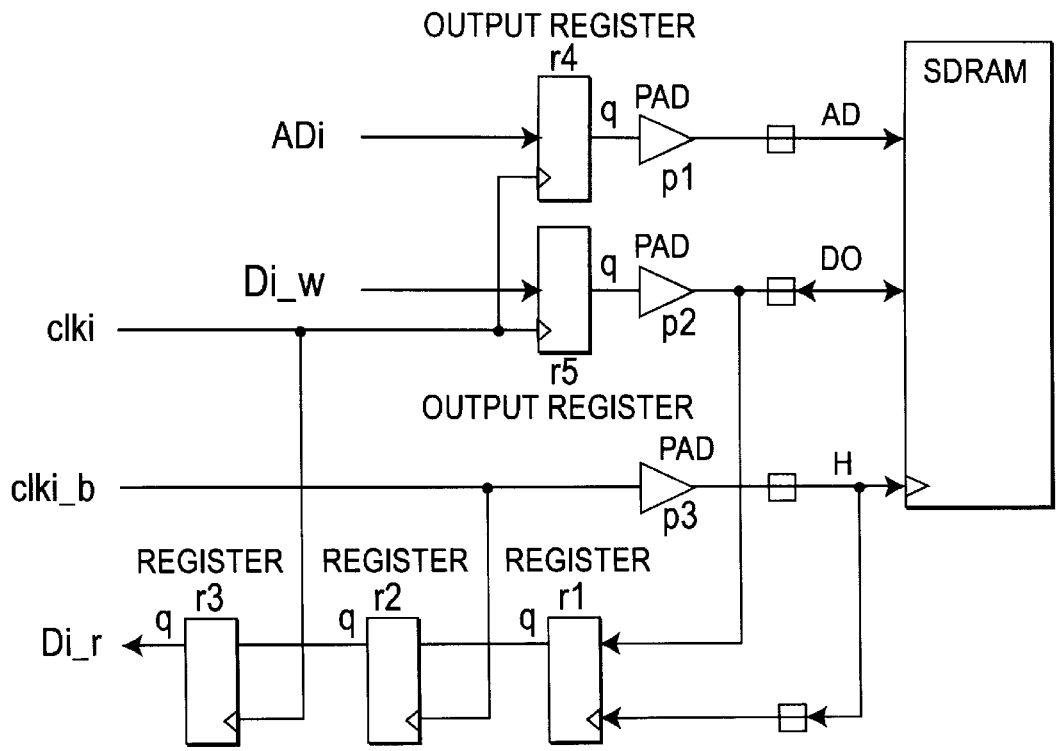
FIG. 4 is a layout of the device according to the invention.

FIG. 4 represents a diagram of the circuits of the synchronization interface of the controller, forming the interface between the controller and the SDRAM memory. The circuits belonging to the controller are represented to the left of the dotted line, and the SDRAM memory is represented to the right of this dotted line.

Figure 1:
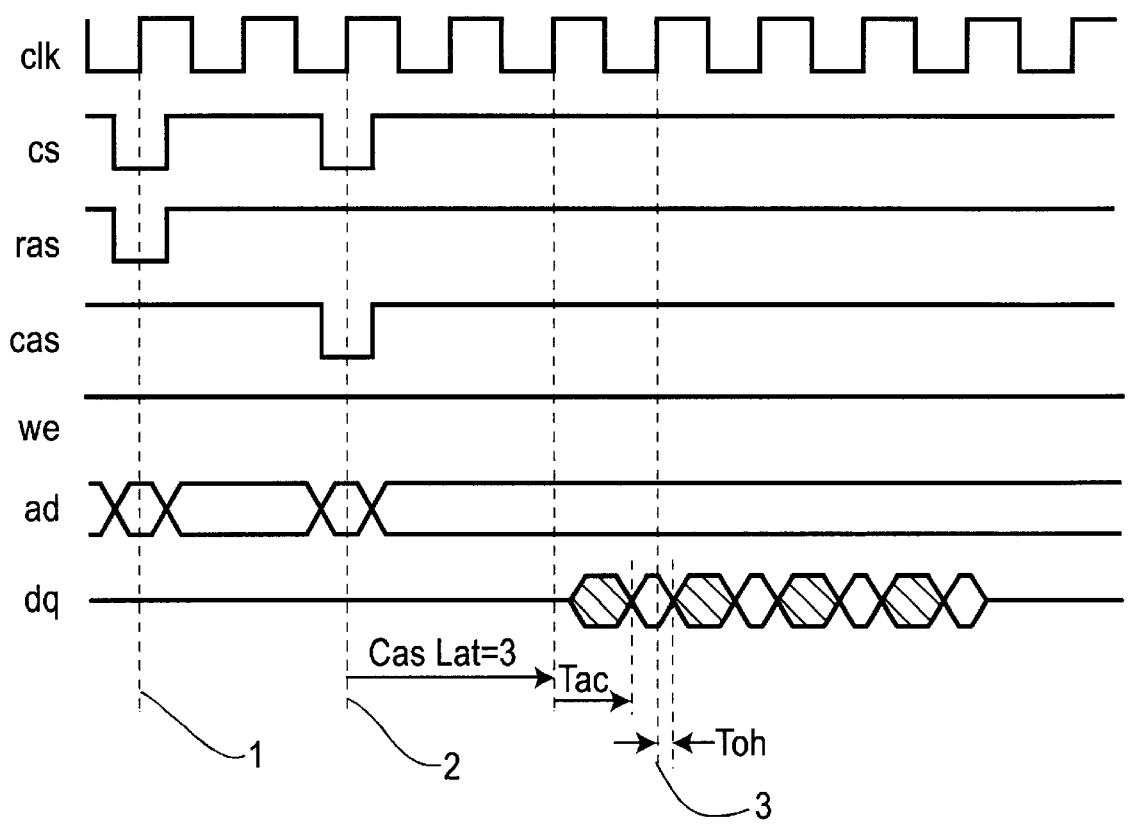
FIG. 1 represents a time diagram of the write operations in an SDRAM memory.
Figure 2:
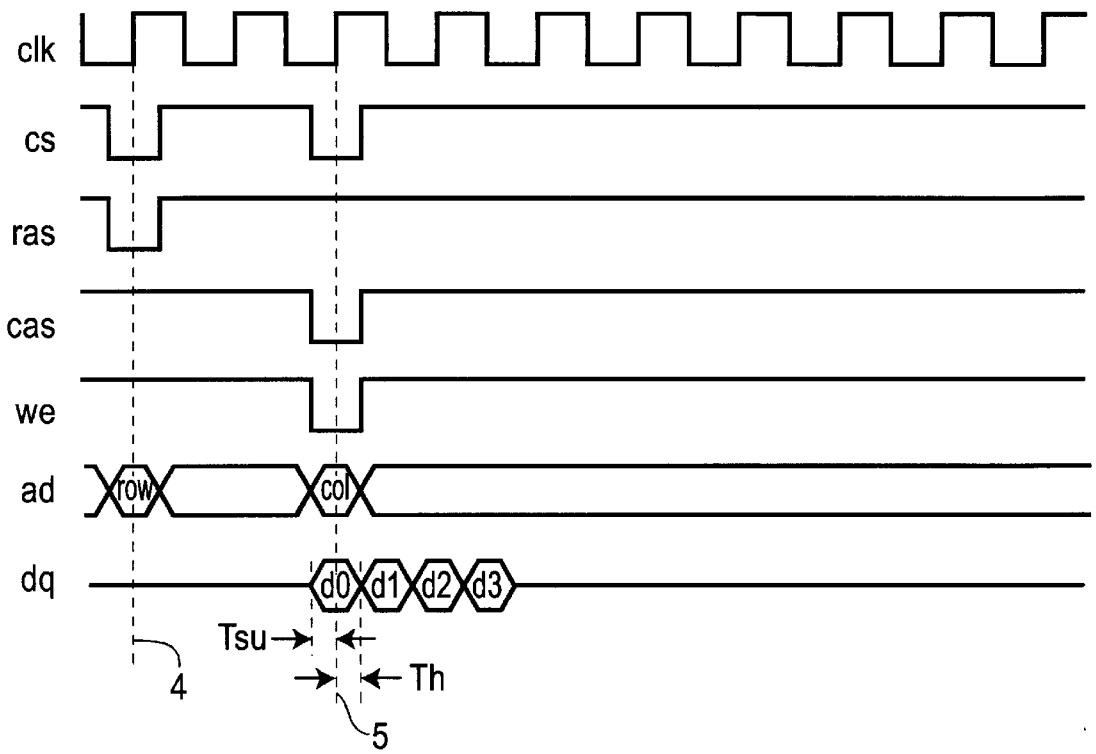
FIG. 2 represents a time diagram of the read operations in an SDRAM memory.
Figure 3:
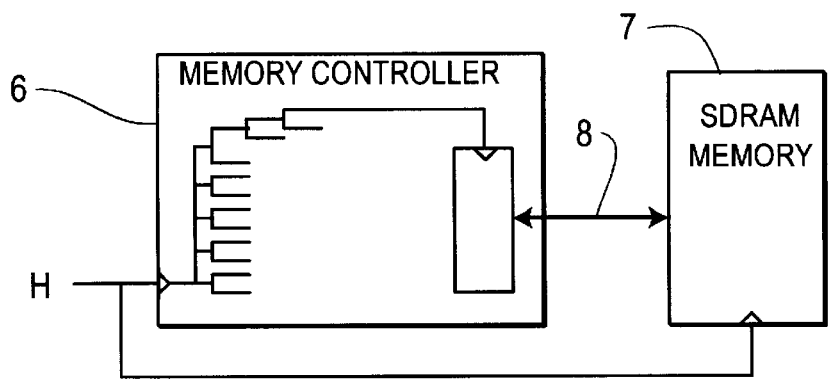
FIG. 3 is a succinct block diagram illustrating distribution of the clock signals according to the prior art.

The main links between the controller and the SDRAM memory, which are represented in this FIG. 4, are the address bus, the data bus and the clock link. There is also the cs, ras, . . . control bus whose management is identical to that of the addresses and data and which is not represented in the figure for the sake of clarity. The controller sends the SDRAM memory the address signals (AD) on the address bus. The data signals (DO) are exchanged between the controller and the SDRAM memory via the two-way data bus. Lastly, the clock signal H, available on the clock output of the controller, is sent to the clock input of the SDRAM memory by a clock link. Thus, unlike in the circuits described in FIG. 3, the clock signal comes directly from the SDRAM controller circuit.

Signal transfer to the SDRAM memory

The address signals AD come from an output register r4. The signals being output from this register pass through an output interface circuit p1, more commonly known as a "pad", before being available on the outputs of the controller. On its inputs, the register r4 receives the internal address signals ADi, which are the signals coming from the addresses received at the input of the controller, after the necessary sampling or interfacing. Similarly, the data signals DO to be sent to the buffer memory come from an output register r5. The signals being output from this register pass through a three-state output interface circuit or pad p2 before being available on the outputs of the controller. On its inputs, the register r5 receives the internal data signals Di_w to be written to the memory, that is to say the data received at the input of the controller after the necessary sampling or interfacing.

As for the clock signal available at the clock output, this comes from an output interface circuit or pad p3. On its input, this circuit receives an internal clock signal clki_b which corresponds to the clock signal received at the input of the controller, after inversion of the signal. The signal referred as clki represents the internal clock signal which is the inverse of the former. The registers r4 and r5 receive the signal clki on their clock input.

Signal transfer to the controller

The data signals sent by the SDRAM memory on the data bus are received by the controller then sent to the input of a register r1. The clock signal available on the clock output of the controller is reinjected on a clock/memory input of the controller, which is a different input from the clock input of the controller. This clock/memory input is connected to the clock input of the register r1, the first of a group of three registers in series. The output of the first register r1 is connected to the input of a second register r2, controlled by the clock signal clki_b, and the output of this second register is connected to the input of a third register r3, itself controlled by the clock signal clki in order to deliver the data Di_r at its output.

Write operation

The information relating to the addresses and data to be written ADi and Di_w are "buffered" respectively in the registers r4 and r5, for example on the rising edge of the clock signal clki. This signal is synchronous with the inverse signal clki_b which delivers the clock signal to the SDRAM memory through the interface circuit p3, and therefore with a delay corresponding to the transfer time in this circuit.

In the registers r4 and r5, the address and data signals are sampled by the clock signal clki. These signals are available on the address and data buses, after a time corresponding approximately to the transfer (or propagation) time of the interface circuits p1 and p2, the time for establishing the data at the output of the registers, in connection with the edge of the sampling clock, being negligible in comparison. The clock signal H corresponds to the internal clock signal clki_b delayed by the transfer time of the interface circuit p3. If interface circuits p1 and p2 having virtually the same transfer time as the interface circuit p3 are chosen, the rising edge of the clock signal H can therefore sample the address and data signals AD and DO while they are valid (in mid bit), and do this with full reliability.

Read operation

The clock signal sent to the SDRAM memory is returned to the clock/memory input of the controller to control the sampling of the data DO delivered by the SDRAM memory on the data bus. Because the clock of the SDRAM memory is the same as the sampling clock for the data in the register r1, there is no problem of an offset between the signals, and the data are also faithfully read by the controller. The registers r2 and r3 make it possible to synchronize the sampled data with the internal clock clki. The read data Di_r leaving the register r3 are synchronized with the internal clock clki.

Figure 5:
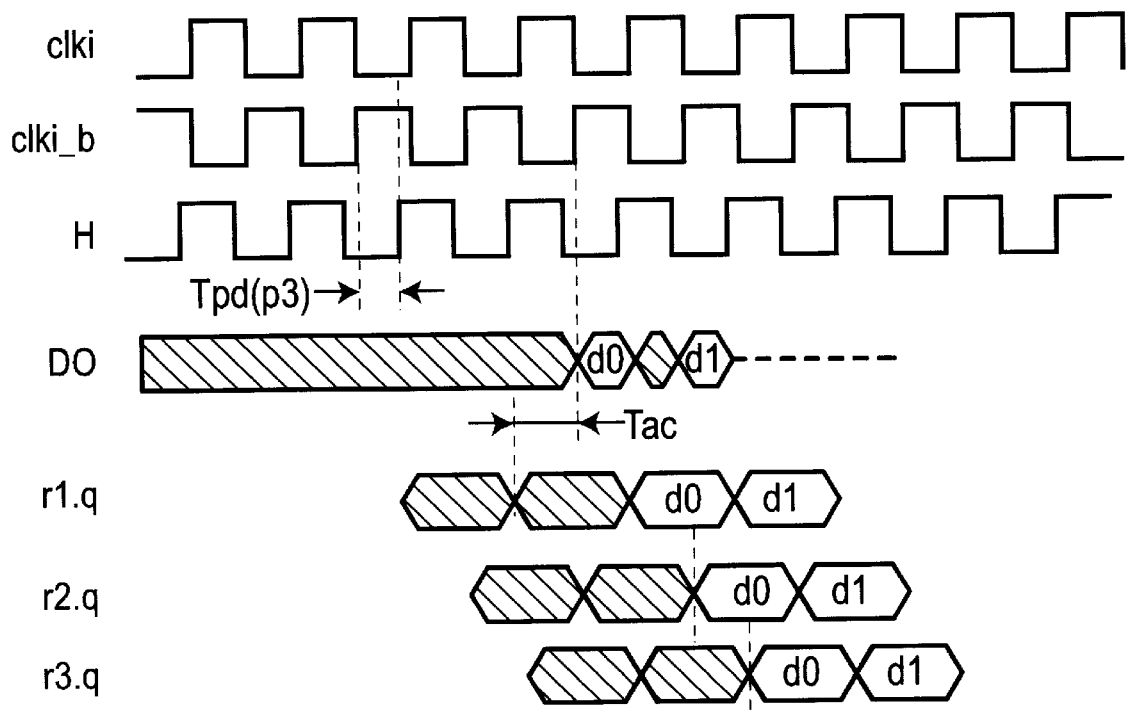
FIG. 5 is a time diagram corresponding to the layout of the device according to the invention.

FIG. 5 represents a chronological diagram of the read operations for the SDRAM memory which are implemented by the device according to the invention.

The time interval Tpd(p3) represents the delay due to the interface circuit p3, and therefore the delay of the clock signals H relative to the internal signals clki_b.

The data DO (do, d1, . . . ) available, on the data bus, after an access time Tac following the rising edge of the clock signal H, are sampled in the register r1 at the next rising edge of this clock signal H.

The data do, d1 . . . sampled in the register r1 at the rising edge of the clock are available at the output of the register (r1q) after an establishing time which is negligible in comparison with Tpd(p3). The registers r2 and r3 make it possible to synchronize the data delivered at their respective outputs r2q and r3q, respectively with the rising edge of the internal clock ciki_b and clki.

It should be noted that if Tsu(r2) is the data set-up time at the input of the register r2 with respect to the rising edge of the clock signal clki_b received at the input, and if Tq(r1)

is the establishing time of the register r1 with respect to the rising edge of the clock H, the cycle period T of the clock signal H must satisfy the inequality:

$$Tpd(p3)+Tq(r1)+Tsu(r2)<Tcycle$$

This inequality makes it possible to determine the frequency up to which the device can function.

In the description which has been given, the clock signal available on the clock output of the controller is reintroduced at the clock/memory input. This is in order to obtain a signal which is as close as possible to the signal received by the SDRAM memory. It is, of course, quite conceivable without departing from the scope of the invention to use the clock signal directly at output from the circuit p3 then send it to the clock input of the register r1.

The applications relate to circuits for managing and controlling memories of the SDRAM type, for example circuits for managing video memories such as synchronous graphic random access memories (SGRAMs).

What is claimed:

1. A processing device comprising:
   a synchronous dynamic random-access memory;
   a controller circuit;
   an address bus linking said controller circuit to said memory; and
   a data bus linking said controller circuit to said memory, wherein said controller circuit includes a first buffer for buffering addresses transmitted across said address bus and a second buffer for buffering data transmitted across said data bus in response to a trigger signal, and said memory includes a clock input linked to a clock output of said controller circuit, said controller circuit providing a clock signal derived from said triggering signal to said clock input.

2. The device according to claim 1, wherein said controller circuit further comprises:
   a third buffer for receiving data from said data bus and including a clock input;
   a first interface circuit for providing said buffered data to said data bus;
   a second interface circuit for providing said buffered addresses to said address bus; and
   a third interface circuit for providing said clock signal to said clock input of said third buffer, wherein said first, second and third interface circuits have a substantially equal transfer time and said clock signal triggers said third buffer.

3. The device according to claim 2, wherein said controller further comprises:
   a fourth buffer; and
   a fifth buffer, said fourth and fifth buffers being connected in series at an output of said third buffer, wherein said fourth buffer is triggered by an inverse of said triggering signal and said fifth buffer is triggered by said triggering signal to provide data from said third buffer in synchronism with said triggering signal.

4. The device according to claim 3, wherein said controller circuit further includes a circuit clock input linked to said clock input of said third buffer, said clock signal provided by said controller circuit being reinput through said clock input for triggering said third buffer.

* * * * *